United States Patent [19]

Sagano

[11] Patent Number: 5,437,557
[45] Date of Patent: Aug. 1, 1995

[54] IC SOCKET

[75] Inventor: Hideki Sagano, Kawasaki, Japan

[73] Assignee: Yamaichi Electronics Co., Ltd., Tokyo, Japan

[21] Appl. No.: 172,174

[22] Filed: Dec. 23, 1993

[30] Foreign Application Priority Data

Dec. 25, 1992 [JP] Japan .................. 4-358431

[51] Int. Cl.$^6$ .............................. H01R 9/09
[52] U.S. Cl. ........................ 439/72; 439/526
[58] Field of Search ............ 439/68, 69, 70, 71, 439/72, 73, 330, 331, 525, 526

[56] References Cited

U.S. PATENT DOCUMENTS

| 4,266,840 | 5/1981 | Seidler | 439/330 |
|---|---|---|---|
| 4,682,829 | 7/1987 | Kunkle et al. | 439/70 |
| 4,746,299 | 5/1988 | Matsuoka et al. | 439/70 |
| 4,984,991 | 1/1991 | Nishimoto | 439/70 |
| 5,249,971 | 10/1993 | Lai et al. | 439/70 |

FOREIGN PATENT DOCUMENTS 0149893  6/1991  Japan .................. 439/71

Primary Examiner—Larry I. Schwartz
Assistant Examiner—Hien D. Vu
Attorney, Agent, or Firm—Wenderoth, Lind & Ponack

[57] ABSTRACT

An IC socket comprising an IC platform and a restriction wall formed on the IC platform and adapted to restrict distal ends of leads on an IC or a side surface of the IC. The restriction wall includes a slant surface for guiding the IC when the IC is loaded on the IC socket. The slant surface is oriented such that the IC is turned in a horizontal direction in order to correct the horizontal inclination of the IC.

14 Claims, 4 Drawing Sheets

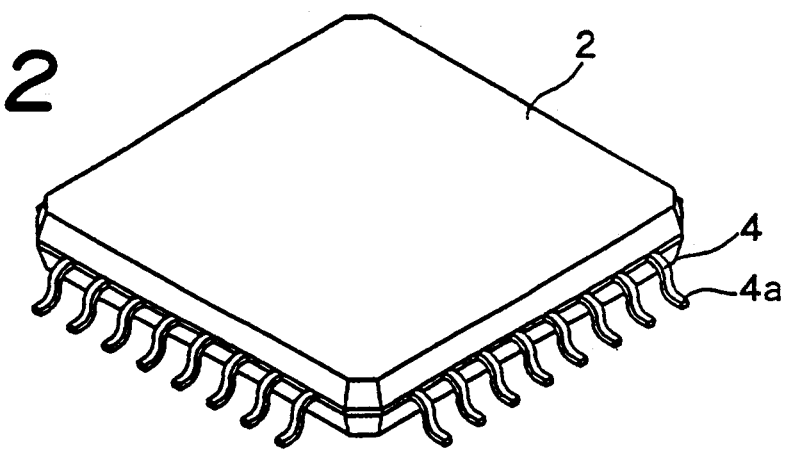
FIG.2
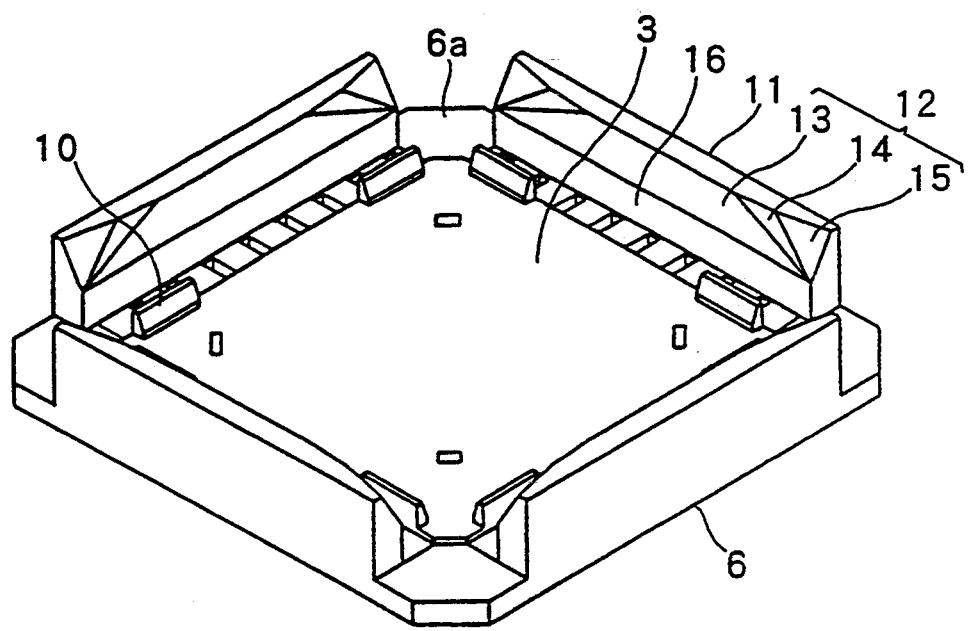
FIG.3
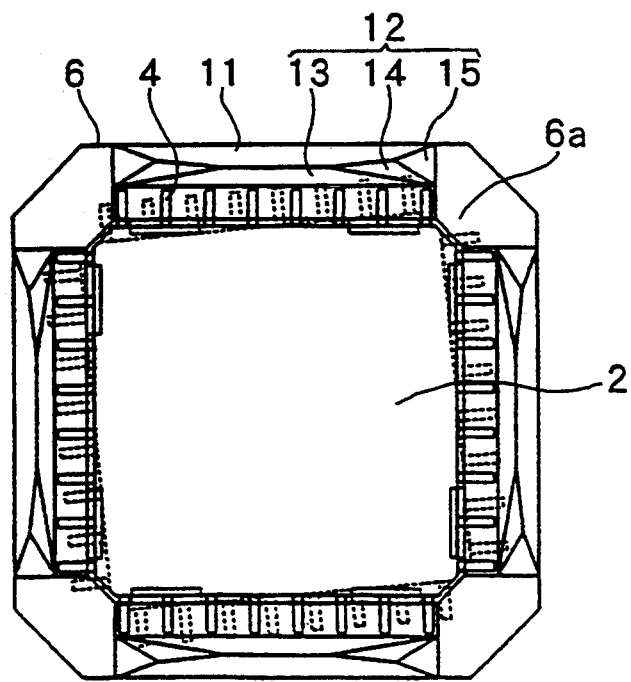

IC SOCKET

BACKGROUND OF THE INVENTION

1. Field of the Invention

This invention relates to an IC socket in which a wall for restricting a side surface of an IC is provided with a slant surface adapted to guide the IC when the IC is loaded on the IC socket.

2. Prior Art

A conventional IC socket of this type has a vertically inclining slant surface (i.e. a surface inclined relative to the vertical) formed on a restriction wall for restricting a side surface of an IC, so that the IC can be smoothly inserted and correctly positioned by the slant surface.

In the case where the IC is loaded on the IC socket by a robot holding a central part of the IC, the IC tends to be inclined in a horizontal direction (i.e. improperly oriented in a horizontal plane) even if the central part of the IC is correctly held by the robot. If the IC is overly inclined in the horizontal direction, the IC will climb over the restriction wall during the of loading process the IC onto the IC socket, and leads will collide against the restriction wall and become deformed.

SUMMARY OF THE INVENTION

It is therefore an object of the present invention to provide an IC socket, in which the horizontal orientation of IC leads and an IC body can be adequately adjusted so that the leads and contacts on the socket are correctly placed in opposed relation.

According to the present invention, there is provided an IC socket comprising an IC platform and a restriction wall formed on the IC platform and adapted to restrict distal ends of leads on an IC or a side surface of the IC, the restriction wall including a slant surface for guiding the IC when the IC is loaded on the IC socket, wherein the slant surface is oriented such that the IC is turned in a horizontal direction (i.e. in a horizontal plane) in order to correct the horizontal orientation of the IC.

BRIEF DESCRIPTION OF THE DRAWINGS

FIG. 2 is a perspective view showing an IC and an IC platform, on which the IC is to be loaded, according to the embodiment of FIG. 1;

FIG. 3 is a plan view for explaining the loading of the IC onto the IC platform, according to the embodiment of FIG. 1;

FIG. 4(B) is an illustration of the IC platform when viewed in a direction as indicated by arrow B of FIG. 4(A), FIG. 4(C) being a sectional view taken on line C-C of FIG. 4(A), FIG. 4(D) being a sectional view taken on line D-D of FIG. 4(A), and FIG. 4(E) being a sectional view taken on line E-E of FIG. 4(A);

DETAILED DESCRIPTION OF THE EMBODIMENT

Embodiments of the present invention will be described with reference to FIGS. 1 through 6.

Figure 1:
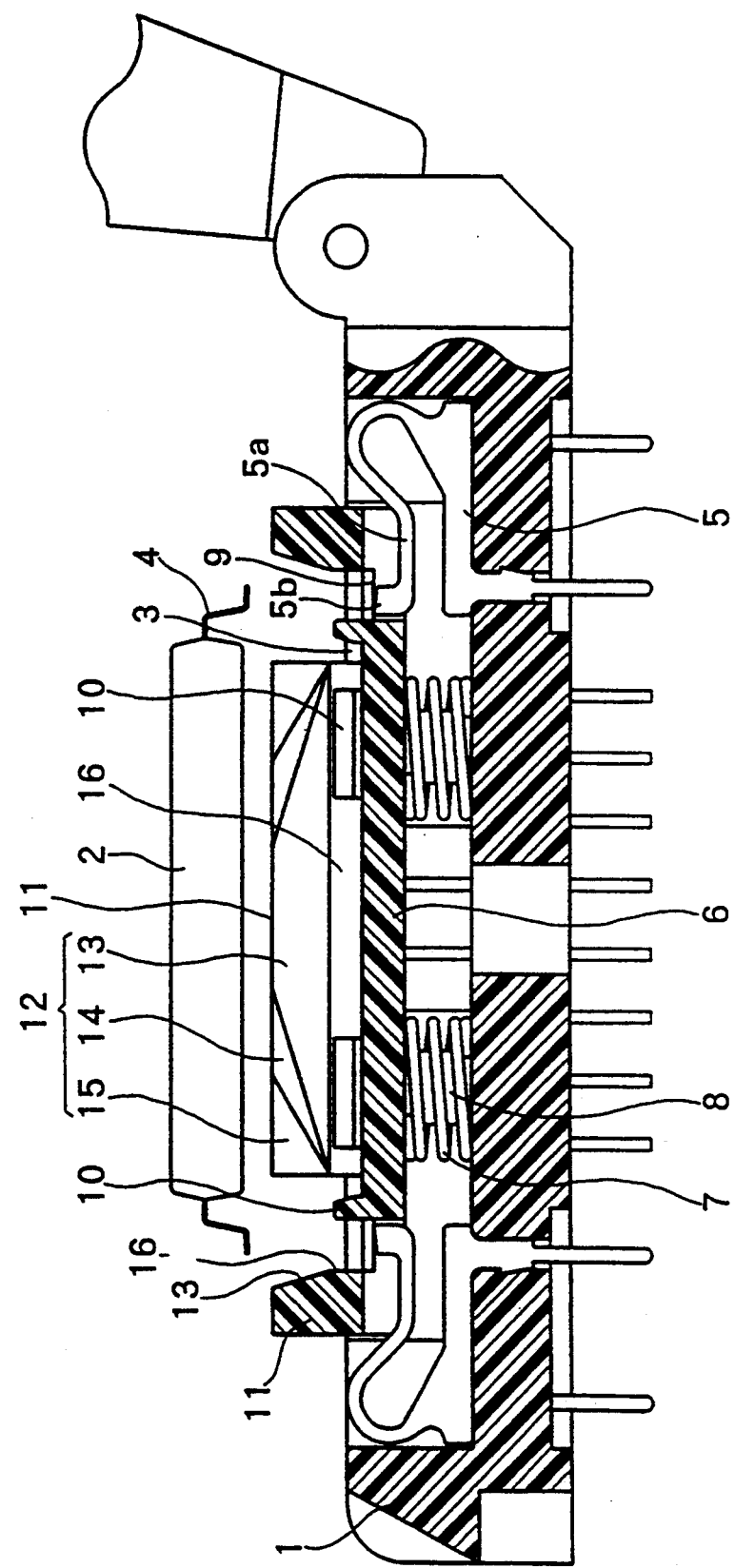
FIG. 1 is a sectional view of an IC socket according to one embodiment of the present invention.
Figure 4A:
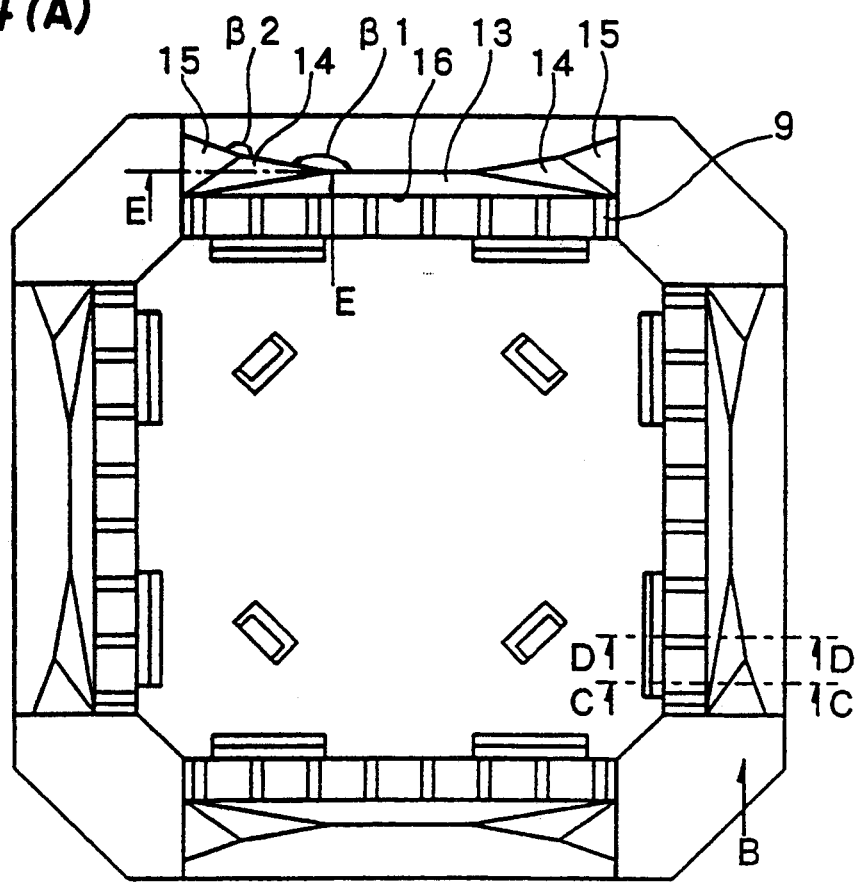
FIGS. 4(A)–4(E) show the IC platform according to the embodiment of FIG. 1, FIG. 4(A) being a plan view.
Figure 4B:
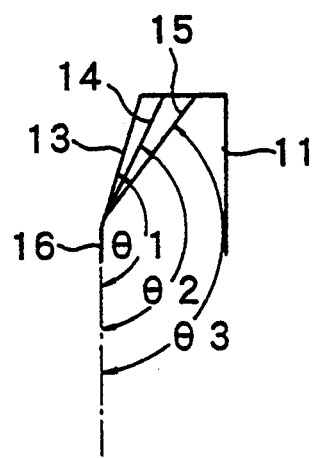
Figure 4C:
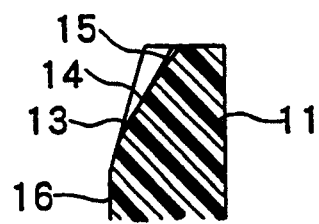
Figure 4D:
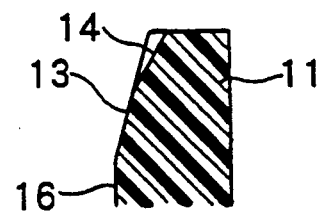
Figure 4E:
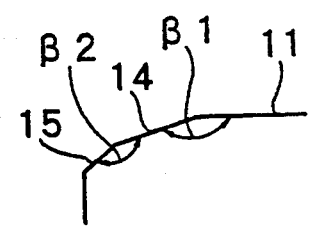

As shown in FIGS. 1 and 2, a socket base 1 formed of a generally square insulating base includes an IC platform 6 which is formed on a central portion thereof and on which an IC 2 is to be loaded in an IC accommodation portion 3. The IC platform 6 is floatably disposed on (resiliently held above) the socket base 1. A plurality of contacts 5 are arranged along four or two sides of an outer periphery of the IC platform 6 and implanted in the socket base 1.

As means for floating the IC platform 6, there is provided springs 7 such as coil springs and the IC platform 6 is resiliently supported on the springs 7 so that the IC platform 6 can be lowered against the biasing force of the springs 7 and raised by the return biasing force of the springs 7. The IC platform 6 is provided with engagement members 8 which are vertically loosely inserted into inner sides of corner portions 6a thereof. Lower ends of the engagement members 8 are inserted into the springs 7 and fixed to the socket base 1, while head portions of the engagement members 8 are brought into engagement with the IC platform 6 so that the IC platform 6 cannot escape therefrom. An uppermost position for the IC platform 6 to be raised is set and the IC platform 6 is integrally assembled together with the socket base 1.

The IC platform 6 is provided with a plurality of holes 9 formed in a peripheral edge portion thereof. These holes 9 are arranged at pitches equal to the contact pitches as well as the IC lead pitches and receive therein contacting portions 5b which are formed on free ends of elastic contact elements 5a of the contacts 5, so that when the IC platform 6 is moved slightly horizontally due to the play between the IC platform 6 and the inner periphery of the socket base 1, the elastic contact elements 5a are moved in response to the movement of the IC platform 6 in order to correctly position the leads 4 and the contacts 5.

The IC platform 6 is provided with projection walls 10 projecting upwardly from an area located inwardly of the holes 9. The projection walls 10 are adapted to restrict the side surfaces of the IC 2 to correctly position the IC 2 on the platform 6.

The IC platform 6 is further provided with restriction walls 11 for the IC 2, formed outwardly of the holes 9. The restriction walls 11 are adapted to restrict the leading ends of the leads 4 on the IC 2 which is loaded on the IC platform 6, so that the IC 2 is correctly positioned. Each of the restriction walls 11 includes a slant surface 12 for guiding the IC 2 when the IC 2 is loaded on the IC platform 6. The slant surface 12 is oriented such that the IC 2 is horizontally turned to correct the horizontal orientation of the IC 2, In the embodiment shown in FIGS. 1 through 4, the slant surface 12 includes a first slant portion 13 formed in an inner surface of a central portion of the restriction wall 11 and having a constant elevation angle $\theta_1$ in a vertical direction (i.e. inclined relative to a vertical guide surface 16), and second and third slant surface portions 14 and 15 formed on inner surface at opposite end portions of the restriction wall 11 (that is, at the corner portion 6a side of an IC loading portion 3) and are inclined vertically and horizontally, respectively (i.e. relative to the vertical guide surface 16 and a vertical plane perpendicular to the vertical guide surface 16, as can be especially seen in FIGS. 2, 4(B) and 4(E)).

More specifically, the second and third slant surface portions 14 and 15 are continuous with the first slant surface portion 13 and retreatingly inclined at one end portion on the corner portion 6a side in a direction away from the side of the corner portion of the IC 2 at clearance angles or relief angles $\beta_1$ and $\beta_2$. The second slant surface portion 14 has a more gentle slope or gradient than the third slant surface portion 15. In other words, the inclination of the third slant surface portion 15 relative to the first slant surface portion 13 is sharper than that of the second slant surface portion 14.

On the other hand, the first slant surface portion 13 is vertically inclined at a central portion of an inner surface of the restriction wall 11 at a constant elevation angle $\beta_1$. A vertical surface 16 is connected to a lower end of the first slant surface portion 13.

The second slant surface portion 13 is horizontally retreatingly inclined at the constant relief angle $\beta_1$ on the corner portion 6a side as mentioned above and inclined vertically of the restriction wall 11 at a constant elevation angle $\theta_2$.

Likewise, the third slant surface portion 15 is horizontally retreatingly inclined at the constant relief angle $\beta_2$ on the corner portion 6a side as mentioned above and inclined vertically of the restriction wall 11 at a constant elevation angle $\theta_3$.

In the case where the IC 2 is loaded on the IC platform 6 in a horizontally inclined posture, as shown by dotted lines of FIG. 3, relative to the IC platform 6, the distal end of the lead 4 on the corner portion side of the IC 2 is guided obliquely downwardly at the elevation angles $\theta_1$, $\theta_2$ and $\theta_3$ of the first, second and third slant surface portions 13, 14 and 15, that is, guided in the concentric direction. At the same time, the distal end of the lead 4 is horizontally turned at the relief angles $\beta_1$ and $\beta_2$ of the second and third slant surface portions 14 and 15. As a result, the IC 2 is restricted by the vertical surface 16 at the lower end of the first slant surface portions 13 as shown by the solid lines of FIG. 3, and the projection walls 10 restrict the side surfaces of the IC 2 so that the IC 2 is loaded in a correct position of the IC loading portion 3, thereby correctly placing the leads 4 and the contacting portions 5b of the contacts 5 in opposed relation. As a result, by pressing down the body of the IC 2 or the leads 4 with a pressing means such as a pressing cover, (not shown), the contacting portions 4a at the distal ends of the leads 4, which are bent in two steps, are brought into pressing contact with the contacts 5 at the holes 9.

Figure 5:
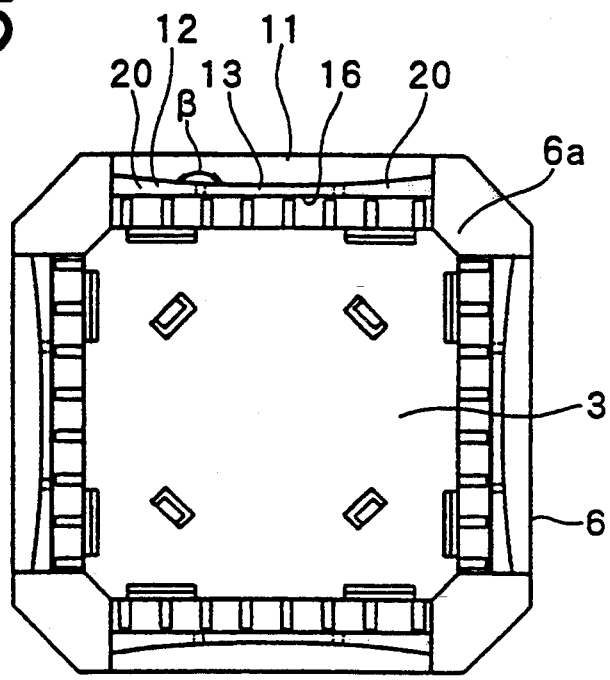
FIG. 5 is a plan view of an IC platform on which an IC is to be loaded, according to another embodiment of the present invention.
Figure 6:
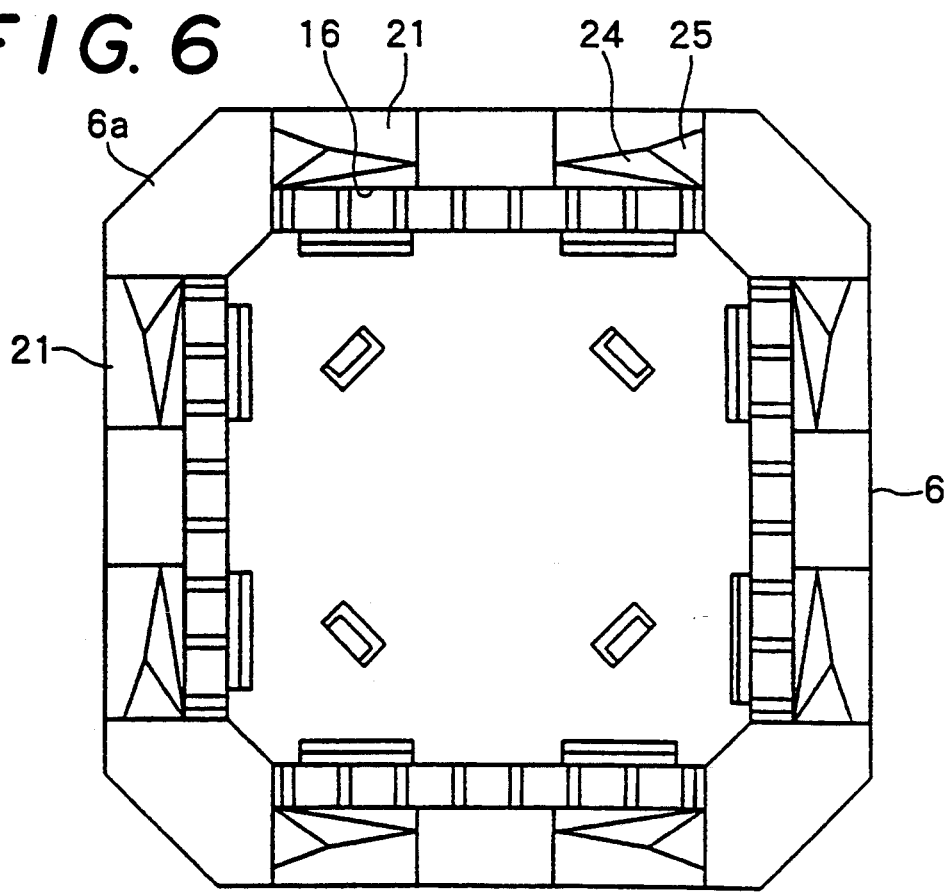
FIG. 6 is a plan view of an IC platform on which an IC is to be loaded, according to a further embodiment of the present invention.

FIGS. 5 and 6 show other examples of the slant surface 12.

In the embodiment shown in FIG. 5, a slant surface portion 20 corresponding to the above-mentioned second and third slant surface portions 14 and 15 is a curved surface vertically and horizontally inclined at an elevation angle and a relief angle gradually changing from a central portion of the restriction wall 11 toward the corner portion 6a, respectively. With this arrangement, when the IC 2 is to be loaded, the leads 4 in a wide range from the central portion of the IC 2 to the corner portion are guided obliquely downwardly by the slant surface portions 20 and 13 having the above elevation angles, and at the same time, the IC 2 is horizontally turned by the slant surface portion 20 having the relief angle $\beta$ in the same manner as mentioned above. As a result, the IC 2 can be loaded in a correct position of the IC platform 6 by being corrected in its horizontal inclination (orientation).

In the embodiment shown in FIG. 6, the IC platform 6 is provided with a corner restriction wall 21 for restricting opposite sides of the corner portions of the IC 2, and the restriction wall portions forming the slant surface portions 13 in the preceding embodiment are eliminated. The corner restriction wall 21 is provided at an inner surface thereof with second and third slant surface portions 24 and 25 vertically and horizontally inclining at a constant elevation angle and relief angle at the corner portions of the restriction wall 11, respectively. With this arrangement, the IC 2 is loaded in the correct position of the IC platform 6 by being corrected in its horizontal inclination as in the above embodiment.

In the embodiments shown in FIGS. 1 through 6, the restriction wall 11 of the IC platform 6 is provided with the slant surface portions. However, the present invention includes a modification in which the IC platform 6 is not provided, and the socket base 1 is provided with the IC loading portion 3, and this IC loading portion 3 is provided with the restriction wall 11 and the slant surface portions.

In the above embodiments, both the restriction wall 11 and the various slant surface portions act on the leads 4. However, the present invention includes a modification in which the restriction wall 11 and the various slant surface portions restrict the side surfaces of the body portion of the IC 2 in order to correct the posture of the IC 2. In this case, the restriction wall including the slant surface elements may be formed at a location corresponding to the projection wall 10. For details, reference is made to the above description.

As described in the foregoing, when the IC is loaded, the slant surface causes the IC to turn horizontally so as to adequately correct the horizontal inclination. As a result, the IC can be properly loaded in a correct position of the IC loading portion. In addition, the leads are prevented from colliding against the restriction wall, thus positively preventing the leads from being deformed.

What is claimed is:

1. An IC socket comprising:
   a generally horizontal IC platform having an IC accommodation portion;
   a restriction wall projecting upwardly from said IC platform at a periphery of said IC accommodation portion, said restriction wall having a vertical guide surface and a slanted guide surface;
   wherein said slanted guide surface of said restriction wall includes a first slant portion inclined relative to said vertical guide surface, and a second slant portion inclined relative to both said vertical guide surface and a vertical plane which is perpendicular to said vertical guide surface; and
   wherein said second slant portion of said slanted guide surface constitutes a means for correcting a horizontal orientation of a horizontally misoriented IC as the IC is being inserted in said IC accommodation portion of said IC platform.

2. An IC socket as recited in claim 1, wherein
   said means constituted by said second slant portion of said slanted guide surface is operable to engage leads of a horizontally misoriented IC to horizontally turn the IC until the IC is correctly oriented, as the IC is being inserted in said IC accommodation portion of said IC platform.

3. An IC socket as recited in claim 1, wherein said means constituted by said second slant portion of said slanted guide surface is operable to engage an IC body of a horizontally misoriented IC to horizontally turn the IC until the IC is correctly oriented, as the IC is being inserted in said IC accommodation portion of said IC platform.

4. An IC socket as recited in claim 1, wherein
said slanted guide surface of said restriction wall further includes a third slant portion inclined relative to both said vertical guide surface and the vertical plane which is perpendicular to said vertical guide surface, said third slant portion further being inclined relative to said second inclined portion.

5. An IC socket as recited in claim 4, wherein
said first, second and third slant portions together constitute a continuous surface.

6. An IC socket as recited in claim 1, wherein
said first and second slant portions together constitute a continuous surface.

7. An IC socket as recited in claim 1, wherein
said restriction wall has first and second ends;
said first slant portion of said slanted guide surface is provided at a central portion between said first and second ends of said restriction wall;
said second slant portion is provided adjacent said first end of said restriction wall; and
said slanted guide surface includes a further guide surface inclined relative to both said vertical guide surface and the vertical plane which is perpendicular to said vertical guide surface, said further guide surface being provided adjacent said second end of said restriction wall.

8. An IC socket comprising:
a generally horizontal IC platform having an IC accommodation portion;
a plurality of restriction walls projecting upwardly from said IC platform at a periphery of said IC accommodation portion, each of said restriction walls having a vertical guide surface and a slanted guide surface;
wherein said slanted guide surface of each of said restriction walls includes a first slant portion inclined relative to said vertical guide surface, and a second slant portion inclined relative to both said vertical guide surface and a vertical plane which is perpendicular to said vertical guide surface; and
wherein said second slant portion of said slanted guide surface of each of said restriction walls constitutes a means for correcting a horizontal orientation of a horizontally misoriented IC as the IC is being inserted in said IC accommodation portion of said IC platform.

9. An IC socket as recited in claim 8, wherein
said means constituted by said second slant portion of said slanted guide surface of each of said restriction walls is operable to engage leads of a horizontally misoriented IC to horizontally turn the IC until the IC is correctly oriented, as the IC is being inserted in said IC accommodation portion of said IC platform.

10. An IC socket as recited in claim 8, wherein
said means constituted by said second slant portion of said slanted guide surface of each of said restriction walls is operable to engage an IC body of a horizontally misoriented IC to horizontally turn the IC until the IC is correctly oriented, as the IC is being inserted in said IC accommodation portion of said IC platform.

11. An IC socket as recited in claim 8, wherein
said slanted guide surface of each of said restriction walls further includes a third slant portion inclined relative to both said vertical guide surface and the vertical plane which is perpendicular to said vertical guide surface, said third slant portion further being inclined relative to said second inclined portion.

12. An IC socket as recited in claim 11, wherein
for each of said restriction walls, said first, second and third slant portions together constitute a continuous surface.

13. An IC socket as recited in claim 8, wherein
for each of said restriction walls, said first and second slant portions together constitute a continuous surface.

14. An IC socket as recited in claim 8, wherein
each of said restriction walls has first and second ends;
said first slant portion of said slanted guide surface of each of said restriction walls is provided at a central portion between said first and second ends thereof;
said second slant portion of said slanted guide surface of each of said restriction walls is provided adjacent said first end thereof; and
said slanted guide surface of each of said restriction walls includes a further guide surface inclined relative to both said vertical guide surface and the vertical plane which is perpendicular to said vertical guide surface, said further guide surface being provided adjacent said second end of the respective one of said restriction walls.

* * * * *